United States Patent
Garcia et al.

(10) Patent No.: US 10,175,333 B2
(45) Date of Patent: Jan. 8, 2019

(54) RADIATION DOSIMETER AND DOSE MEASUREMENT METHOD BY EPR SPECTROSCOPY

(71) Applicants: Institut de Radioprotection et de Sûreté Nucléaire, Fontenay-Aux-Roses (FR); COMMISSARIAT A L'ENERGIE ATOMIQUE ET AUX ENERGIES ALTERNATIVES, Paris (FR)

(72) Inventors: Tristan Garcia, Paris (FR); François Trompier, Fontenay Aux Roses (FR)

(73) Assignees: Institut de Radioprotection et de Sûreté Nucléaire (FR); COMMISSARIAT A L'ENERGIE ATOMIQUE ET AUX ENERGIES ALTERNATIVES (FR)

( * ) Notice: Subject to any disclaimer, the term of this patent is extended or adjusted under 35 U.S.C. 154(b) by 378 days.

(21) Appl. No.: 14/903,907

(22) PCT Filed: Jul. 9, 2014

(86) PCT No.: PCT/EP2014/064697
§ 371 (c)(1),
(2) Date: Jan. 8, 2016

(87) PCT Pub. No.: WO2015/004176
PCT Pub. Date: Jan. 15, 2015

(65) Prior Publication Data
US 2016/0146919 A1 May 26, 2016

(30) Foreign Application Priority Data
Jul. 9, 2013 (FR) .................................... 13 56748

(51) Int. Cl.
*G01V 3/00* (2006.01)
*G01R 33/60* (2006.01)
(Continued)

(52) U.S. Cl.
CPC ................ *G01R 33/60* (2013.01); *G01T 1/02* (2013.01); *G01T 1/04* (2013.01)

(58) Field of Classification Search
CPC .... G01R 33/60; G01R 33/441; G01R 33/345; G01N 24/10; G01N 24/08
(Continued)

(56) References Cited

U.S. PATENT DOCUMENTS 3,638,017 A * 1/1972 Jones ...................... G01T 1/115
235/491
3,728,543 A * 4/1973 Buckman .................. G01T 1/11
250/483.1
(Continued)

OTHER PUBLICATIONS

Al-Karmi A M et al: "EPR of gamma-irradiated polycrystalline alanine-in-glass dosimeter", Radiation Measurements, Elsevier, Amsterdam. NL, vol. 43. No. 7, Aug. 1, 2008 (Aug. 1, 2008) pp. 1315-1318. XP023784578, ISSN: 1350-4487, DOI:10.1016/J. RADMEAS.2008.04.088 [retrieved on Apr. 29, 2008] p. 1316; figures 1, 2.
(Continued)

*Primary Examiner* — Walter L Lindsay, Jr.
*Assistant Examiner* — Frederick Wenderoth
(74) *Attorney, Agent, or Firm* — Lerner, David, Littenberg, Krumholz & Mentlik, LLP

(57) ABSTRACT

The invention relates to a dosimeter comprising a quantity of dosimetric material, the dosimeter being suitable for being irradiated and undergoing a dose measurement by EPR spectroscopy, the enclosure being made from a material not having a response in EPR spectroscopy or having a response different from the response of the dosimetric material after
(Continued)

identical irradiation such that the signal of the material of the enclosure decreases as a function of time after irradiation of said material such that a period of time exists after irradiation at the end of which the material has no measurable signal, or a residual signal whose intensity is less than 5% of that measured after irradiation, and the dosimetric material has a constant EPR signal after irradiation. The invention also relates to a method for measuring the dose absorbed by the dosimetric material contained in such a dosimeter.

15 Claims, 5 Drawing Sheets

(51) Int. Cl.
*G01T 1/04* (2006.01)
*G01T 1/02* (2006.01)

(58) Field of Classification Search
USPC .......................................................... 324/316
See application file for complete search history.

(56) References Cited

U.S. PATENT DOCUMENTS

| | | | | |
|---|---|---|---|---|
| 5,567,948 | A * | 10/1996 | Miller | G01T 1/10 250/484.5 |
| 6,791,324 | B2 * | 9/2004 | Maier | G01R 33/28 324/316 |
| 2003/0218151 | A1 * | 11/2003 | Akselrod | B82Y 10/00 252/301.4 R |
| 2013/0043867 | A1 * | 2/2013 | Corum | G01R 33/4616 324/309 |
| 2013/0105692 | A1 * | 5/2013 | Rink | G01T 1/201 250/336.1 |

OTHER PUBLICATIONS

Anan M. Al-Karmi: "Dosimetric evaluation of alanine-in-glass dosimeters at clinical dose levels using high-energy X-rays from linear accelerator", Radiation Measurements, vol. 45, No. 1, Jan. 1, 2010 (Jan. 1, 2010), pp. 133-135. XP055106906, ISSN: 1350-4487, DOI:10.1016/j.radmeas.2009.10.063 p. 133, col. 2, paragraph 3—p. 135, col. 1 paragraph 1; figure 1.
Bassinet C et al: "Radiation accident dosimetry on glass by TL and EPR spectrometry", Health Physics vol. 38, No. 2, Feb. 1, 2010 (Feb. 1, 2010), pp. 400-405. XP009176842, ISSN: 1538-5159. DOI:10.1097/01. HP.0000346334.72296.51 the whole document.
Chen et al: "Response of L-alanine and 2-methylalanine minidosimeters for K-Band (24GHz) EPR dosimetry", Nuclear Instruments & Methods in Physics Research. Section—B:Beam Interactions with Materials and Atoms. Elsevier, Amsterdam, NL, vol. 264, No. 2, Sep. 20, 2007 (Sep. 20, 2007). pp. 277-281. XP022339847, ISSN: 0168-583X. DOI: 10.1016/J.NIMB.2007.08.097 p. 278, col. 2, paragraph 2—p. 279, col. 1, paragraph 1; figures 4, 6.
Francois Trompier et al: "Radiation-induced signals analysed by EPR spectrometry applied to fortuitous dosimetry", Annali Dell'Istituto Superiore Di Sanita, vol. 45, No. 3, Aug. 4, 2009 (Aug. 4, 2009), pp. 287-296, XP055106844, the whole document.
French Search Report and Written Opinion for Application No. FR13556748 dated Mar. 12, 2014.
International Search Report and Written Opinion for Application No. PCT/EP2014/064697 dated Dec. 19, 2014.
Schaeken B et al: "Implementation of alanine/EPR as transfer dosimetry system in a radiotherapy audit programme in Belgium", Radiotherapy and Oncology, Elsevier, Ireland, vol . 99. No. 1, Jan. 31, 2011 (Jan. 31, 2011). pp. 94-96, XP028193901, ISSN: 0167-8140. DOI:10.1016/J.RADONC.2011.01.026, [retrieved on Feb. 17, 2011] p. 94, col. 1, paragraph 2—p. 95, col. 1. paragraph 1.
Tristan Garcia et al: "Dose verification and calibration of the Cyberknifeby EPR/alanine dosimetry" Radiation Measurements. Elsevier, Amsterdam. NL. vol. 46. No. 9. Mar. 28, 2011 (Mar. 28, 2011), pp. 952-957. XP028291550, ISSN: 1350-4487, DOI:10.1016/ J.RADMEAS.2011.03.031 [retrieved on Apr. 7, 2011] p. 953. col. 1, paragraph 3—p. 955, col. 1. paragraph 2, figure 1.
Trompier F et al: "Radiation accident dosimetry on plastics by EPR spectrometry", Health Physics, vol. 98, No. 2, Feb. 1, 2010 (Feb. 1, 2010), pp. 388-394. XP009176812, ISSN: 1538-5159, DOI:10.1097/ 01. HP.0000346334.78268.31 the whole document.

* cited by examiner

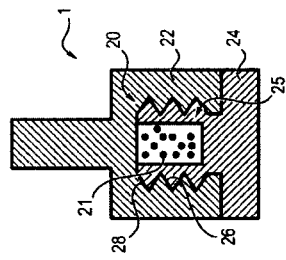
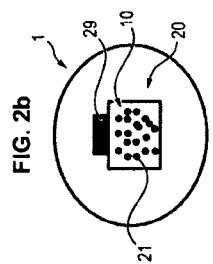
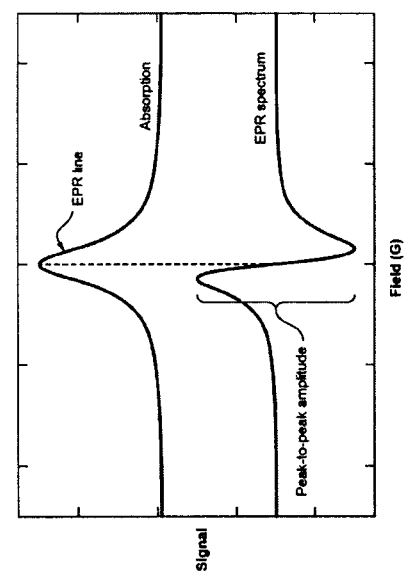

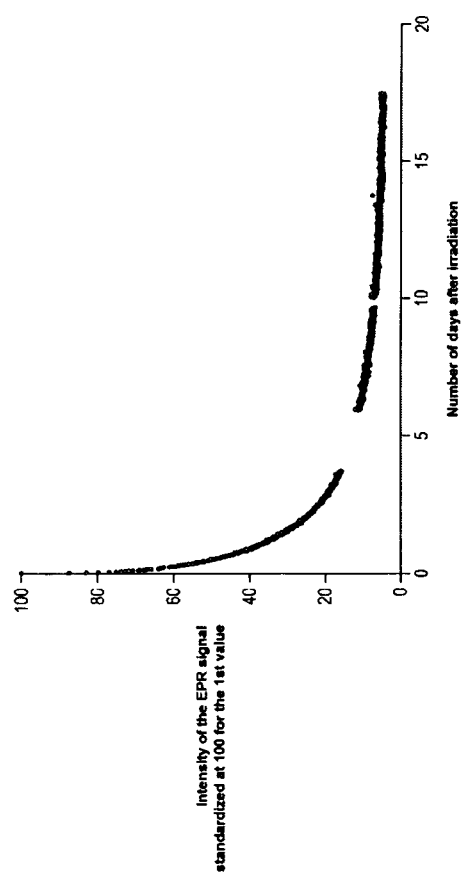

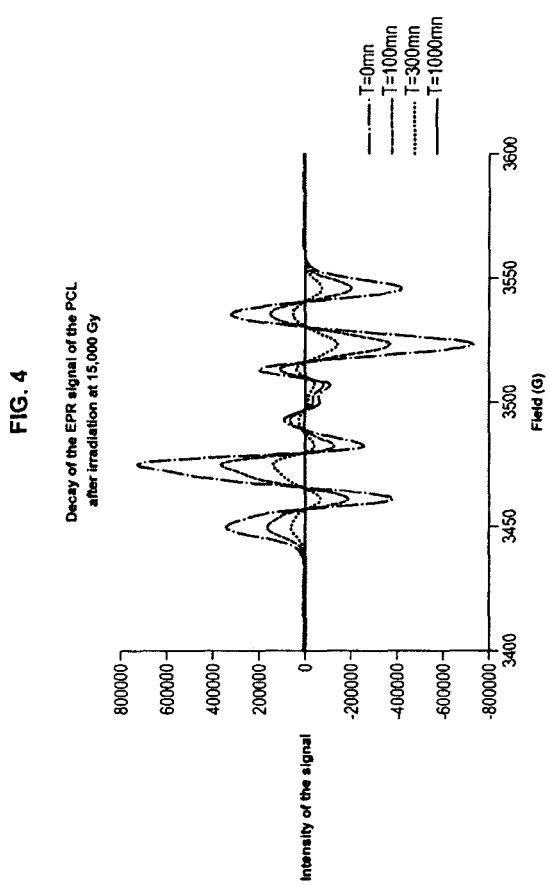

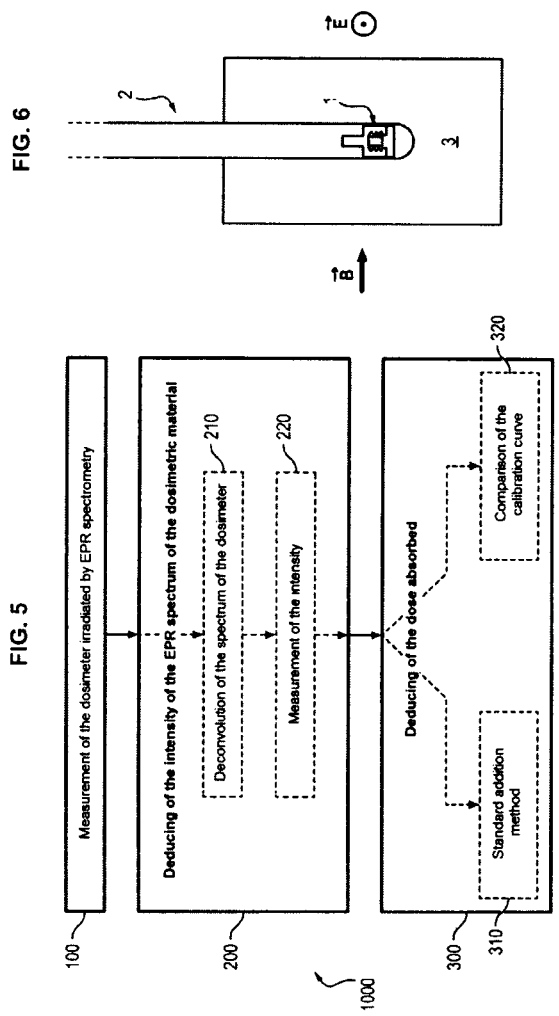

RADIATION DOSIMETER AND DOSE MEASUREMENT METHOD BY EPR SPECTROSCOPY

CROSS REFERENCE TO RELATED APPLICATIONS

The present application is a national phase entry under 35 U.S.C. § 371 of International Application No. PCT/EP2014/064697, filed Jul. 9, 2014, published in French, which claims priority from French Patent Application No. 1356748, filed Jul. 9, 2013, the disclosures of which are incorporated by reference herein.

FIELD OF THE INVENTION

The field of the invention is that of the dosimetry of ionizing radiation, by electron paramagnetic resonance spectroscopy (or EPR spectroscopy). More specifically, the invention relates to a passive measurement device (passive or deferred reading dosimeter) in order to estimate doses (dosimetry) of ionizing radiation for EPR spectroscopy and a method for dosimetry with such a dosimeter.

STATE OF THE ART

EPR spectroscopy is a measurement technique used to estimate the dose deposited in a material after an irradiation with ionizing radiation, i.e. after the interaction of the ionizing radiation (photons, electrons, protons, neutrons, α particles, etc.) with the material.

This technique is applied on materials for which the interaction of the ionizing radiation with the material generates paramagnetic entities of the free radical type (i.e. chemical species comprising at least one unpaired electron), defects or ions in a quantity proportional to the dose deposited in the material in question.

During the measurement of a material by EPR spectroscopy, the material is placed in a magnetic field, provoking the alignment according to the field of the magnetic moments of the paramagnetic entities contained in the dosimetric material in two non-identical proportions according to the direction of rotation of the unpaired electrons (direction parallel or antiparallel to the magnetic field). As these directions of orientation of the magnetic moments of said electrons correspond to different energy levels, this results in a difference in energy between the two energy levels.

Perpendicularly to the magnetic field, the material is also submitted to electromagnetic radiation (of the microwave type by the intermediary of a klystron).

The phenomenon of resonance is reached when the energy provided by the electromagnetic radiation emitted is equal to the difference in energy between the two energy levels of the paramagnetic entities. This resonance drives the coming and going of the unpaired electrons from one energy level to the other. The absorption of the energy required for these transitions is quantified by EPR spectroscopy. In a routine manner, the recorded EPR spectrum, or EPR signal, is the derivative of the absorption signal (FIG. 1).

In order to connect the dose delivered in the material with the intensity of the EPR absorption, several approaches can be used. The area under the integral of the signal measured can for example be used, or the amplitude between the maximum and the minimum (referred to as "peak-to-peak" amplitude) of the first derivative of the absorption peak, also called the EPR line, linked to the paramagnetic species induced by the irradiation. Indeed, the number of radiation-induced paramagnetic species (i.e. induced by the radiation) depends upon the absorbed dose.

Consequently, by measuring for example the peak-to-peak amplitude of the derivative of the absorption spectrum, the dose deposited in the material can be deduced from this by using one of the two following methods.

The first method consists in constructing one or several calibration curves that connect the amplitude to known doses of irradiation using samples similar to those then used to estimate the dose. These samples are irradiated with known doses. The absorption signal of the various samples is then measured and recorded with identical measurement parameters and in similar conditions (environmental conditions). The value of the peak-to-peak amplitude of the EPR absorption line for example of these various samples then makes it possible to establish a curve that connects the amplitude to the dose.

In order to establish the calibration curve, a range of doses is used that covers all of the doses to be evaluated. Furthermore, in order to apply these doses to the calibration material, a beam must be used of which the dose rate is known and of which the energy spectrum corresponds as much as possible to that of the radiation to which the dosimeters to be evaluated have been exposed to. Indeed, for a fixed dose, the quantity of radiation-induced species can differ according to the radiation and the dose rate used.

The material used as dosimeter must have as much as possible a high radiolytic output, i.e. the quantity of paramagnetic species generated per unit of dose or of energy deposited must be high, so that the radio-induced EPR signals can be measured easily. It is necessary to have a relation of proportionality between the absorbed dose and the number of induced paramagnetic species, if possible over a wide range of doses. It is preferable that the radiolytic output be independent of the energy of the irradiation beam and of the type of radiation, and independent of the dose rate. This is the case for example with alanine, an amino acid which is commonly used in the dosimetry of ionizing radiation by EPR spectroscopy in the national laboratories of ionizing radiation metrology.

The second method is applicable to materials for which the radiolytic output can vary greatly from one sample to another, as for example bone tissue or minerals. For these materials, in order to estimate the doses absorbed in the materials, the method referred to as "standard addition" is used, which consists in establishing a relationship between the intensity of the absorption linked to the radiation-induced paramagnetic species and the dose absorbed in the studied sample.

For this sample, a first series of measurements of EPR spectra is carried out, then the sample is irradiated with additional known doses, and after each irradiation another series of measurements is taken in order to determine its sensitivity coefficient, i.e. the variation in the intensity of the absorption in relation to the variation of the dose.

This coefficient is then used to convert in terms of the dose absorbed the intensity of the absorption recorded before the post-irradiation process. The measurements are taken in the same experimental conditions and with the same measurement parameters.

EPR spectroscopy has many applications such as the dating of archeological samples using the dose accumulated by natural irradiation, the estimating of the dose received during radiological accidents using biopsies made on the victims or materials worn by the latter or coming from their direct environment, the identifying of irradiated food products, the estimating of the dose received by individuals during a chronic and/or former exposure, using biopsies of dental enamel, or the calibrating and the controlling of radiation sources.

It can also be used to verify the level of the dose absorbed by an object that is sought to be sterilized via irradiation.

A dosimetric material commonly used for measuring the dose by EPR spectroscopy is alanine; this is an amino acid of which the radiation-induced paramagnetic species have the advantage of a substantial stability over time in normal conditions of temperature and humidity, i.e. the intensity of the EPR spectrum after irradiation is stable over several months or even years. Furthermore, as alanine is one of the 20 amino acids present in living beings, the response to the ionizing radiation of alanine is close to that of a biological tissue, which implies for example for the photons a radiolytic output that is quasi-independent of the energy of the photons (in an extended energy range (from a few hundred keV to a few MeV) when the dosimetric references are given in terms of the dose in the tissue.

To date, alanine is routinely used for industrial irradiations:
- Agro-foods: hygienization/sterilization—public—the immunocompromised
- Single-use products: sterilization (prostheses, gloves, syringes, etc.)
- Drugs: sterilization (coming from biotechnologies or heat-sensitive)
- Materials: stability in terms of irradiation, aging Alanine is also used in particular to control the levels of dose received during an irradiation by a medical treatment of the radiotherapy type or in radiobiology during the irradiation of small animals or other biological samples.

To do this, pellets of alanine, comprising an alanine powder, mixed with one or several excipients that make it possible to provide it with a stable form, are deposited in a dedicated container, which is positioned in a tank or a mannequin that reproduces the thickness of the tissue to be passed through by the ionizing beam in order to reach a tumor to be treated. The alanine is then irradiated by the beam, then the pellets are recovered and placed in glass tubes in order to take the measurement of the dose by EPR spectroscopy.

However, the ionizing beams used in the treatments of radiotherapy and radiosurgery are increasingly small, in order to allow for increasingly precise treatments. The beam can indeed be limited to a diameter of a magnitude of the millimeter, and even less. As the alanine pellets currently used have a diameter of a few millimeters, they do not make it possible to integrate the dose delivered by the beam over all of its geometry.

There is therefore a need to propose a dosimeter of which the geometry is suited to the dimensions of the beams used in radiotherapy.

Efforts have been deployed in order to carry out alanine pellets of reduced size. However the presence of an excipient becomes problematic at such dimensions: indeed, as the quantity of alanine powder contained in each pellet is even lower as it is linked by the excipient, the measurement is not as precise and is less sensitive. In addition, most of the excipients have parasite EPR signals whether with or without irradiation. Furthermore, the alanine powder is distributed heterogeneously in the pellet, which can degrade the reproducibility of the measurements.

Finally, the alanine pellets of reduced size are very fragile, manipulating them is therefore difficult and furthermore has a risk of losing a portion of the irradiated dosimetric material, which further degrades the quality of the measurement, as it is then required to correct the measurements of the difference in mass between the broken pellets and those that remain intact.

The solutions already proposed have therefore not succeeded in achieving a compromise between the size of the dosimeter and the precision of the measurement and of the estimation of the doses.

Presentation of the Invention

The invention has for purpose to overcome the aforementioned problem. In particular, the invention has for object to propose a dosimeter of which the dimensions can be reduced in order to be adapted to a use in radiotherapy and radiosurgery, without degrading the quality of the measurement.

Another purpose of the invention is to propose a dosimeter that makes it possible to be free of the excipient used in order to confine the dosimetric material.

A purpose of the invention is furthermore to propose a dosimeter of which the geometry can be modulated according to its application.

Another purpose of the invention is to propose a dosimeter with easy manipulation.

Another purpose of the invention is that it can be applied also for the other fields of dosimetry of ionizing radiation in particular in an industrial context.

In this respect, the invention has for object a radiation dosimeter for EPR spectroscopy, comprising a quantity of dosimetric material, with the dosimeter being suitable for being irradiated and undergoing a dose measurement by EPR spectroscopy, the dosimeter characterized in that it further comprises a closed enclosure containing said dosimetric material, with the enclosure being made from a material that does not have a response by EPR spectroscopy or that has a response by EPR spectroscopy that is different from the response of the dosimetric material after identical irradiation, such that the signal measured by EPR spectroscopy of the material of the enclosure decays according to the time after irradiation of said material such that a period of time exists after irradiation at the end of which the material has no measurable EPR signal, or a residual signal of which the intensity is less than 5% of that measured after irradiation, and the dosimetric material has a constant EPR signal according to the time after irradiation of said material.

Advantageously, but optionally, the dosimeter according to the invention can furthermore include at least one of the following characteristics:
- the dosimetric material is in a powder, solid or liquid form.
- the enclosure is made from a material that is sealed from liquids and gases.
- the enclosure is made from a material that is biocompatible in terms of the standard ISO10-993.
- the enclosure further comprises an etched or printed marking, or a radio-opaque insert.
- the signal measured by EPR spectroscopy of the material of the enclosure decays according to the time after irradiation of said material such that a period of time exists after irradiation at the end of which the material has no EPR signal, and the dosimetric material has a constant EPR signal according to the time after irradiation of said material.
- the material wherein is carried out the enclosure is polycaprolactone.
- the EPR signals of the dosimetric material and of the material of the enclosure each comprise an absorption line of electromagnetic energy according to a magnetic field applied to the material, and the absorption lines of the dosimetric material and of the material of the enclosure extend respectively over:
- separate ranges of energies with an identical magnetic field, or
- separate ranges of magnetic fields with identical electromagnetic energy.

the dosimetric material is chosen from the following group: alanine, bone, carbohydrates, ammonium formate, potassium dithionate, mineral glasses, dental enamel, dentine, polymers.

the dosimetric material is pure.

The invention also relates to a method for measuring by EPR spectroscopy of dose absorbed by a quantity of dosimetric material contained in such a dosimeter, said dosimeter having been irradiated with an unknown dose, with the method being implemented after a period of time elapsed after the irradiation of the dosimeter at the end of which the material of the enclosure does not have an EPR signal, with the EPR signal of the dosimeter then corresponding to the EPR signal of the dosimetric material, and comprising the steps consisting in:
- implementing a measurement by EPR spectroscopy of a dosimeter in order to obtain an EPR signal of the dosimeter,
- deducing from the EPR signal of the dosimeter the intensity of the EPR signal of the dosimetric material, and
- deducing from the intensity of the EPR signal of the dosimetric material a dose absorbed by said material during an irradiation.

Advantageously, but optionally, the method of measurement according to the invention can furthermore comprise at least one of the following characteristics:
- the deducing of the intensity of the EPR signal of the dosimetric material using the EPR signal of the dosimeter comprises the obtaining of the EPR signal of the dosimetric material by deconvolution of the EPR signal of the dosimeter and the measurement of the intensity of the EPR signal of the dosimetric material.
- the method is implemented in order to measure a dosimeter of which the material of the enclosure has been subjected to a pre-irradiation before the irradiation of the dosimeter. The deduction of the dose absorbed by the dosimetric material comprises the steps consisting in:
  - irradiating the dosimeter at a plurality of known doses, and at each irradiation, implementing a measurement by EPR spectroscopy of the dosimeter, and deducing from the signal obtained an EPR signal of the dosimetric material,
  - determining a sensitivity coefficient of the dosimeter, and
  - extrapolating, using the intensities of the EPR signals of the dosimetric material, the dose absorbed by the dosimeter.

The invention finally relates to a method of calibrating in order to calibrate a dosimeter in accordance with the preceding description, comprising the irradiation of the dosimeter at a plurality of known doses, and the implementing, at each irradiation, of a measurement by EPR spectroscopy of the intensity of the EPR signal of the dosimeter, in order to establish a relation between the value of the amplitude of said signal and the dose received.

The invention also has for object a method for manufacturing a dosimeter, comprising the formation of an enclosure in one or two portions by molding, injection or machining, the insertion of dosimetric material into a portion of the enclosure and the hermetic sealing of the enclosure.

The dosimeter proposed by the invention makes it possible to measure a dose absorbed by the dosimetric material contained in the dosimeter after an irradiation of the latter, without extracting said material from the dosimeter. Indeed, it is possible, after the dosimeter has been irradiated at an unknown dose, to deduce from a measurement by EPR spectroscopy of the complete dosimeter the dose absorbed by the dosimetric material that it contains.

This has many advantages. Firstly, it is no longer required to manipulate the dosimetric material contained in the dosimeter in order to transfer it from the dosimeter to a support for the spectroscopy measurement.

Losing a quantity of dosimetric material and degrading the quality of the measurements are as such avoided.

Furthermore, it is possible to use the dosimetric material in pure form, i.e. devoid of an excipient, since the dosimetric material can be placed in powder form for example in the enclosure of the dosimeter.

This makes it possible in particular to modify at will the geometry of the dosimeter, and in particular to reduce the dimensions of it, without degrading the quality of the measurement. In particular, in the case of the use of alanine as a dosimetric material, it is possible to use alanine in powder form, and the use of pellets that can have excessively high dimensions in relation to the desired uses can therefore be avoided.

Moreover, many applications can be considered to use the dosimeter proposed, which are described in more detail in what follows.

DESCRIPTION OF THE FIGURES

Other characteristics, purposes and advantages of the invention will come from the following description, which is purely for the purposes of illustration and is not limiting, and which must be read with regards to the annexed drawings wherein:

FIG. 1, already described, shows an example of an absorption spectrum of dosimetric material and its derivative, FIG. 2a shows an example of a radiation dosimeter according to an embodiment of the invention, FIG. 2b shows another example of a radiation dosimeter, FIG. 3a shows the change in the amplitude of the EPR spectrum of a material with a decaying spectrometric response after an irradiation, FIG. 4 shows an example of the EPR spectrum of a radiation dosimeter according to the invention and how it changes over time, FIG. 5 shows the main steps in the method for measuring a dose according to the invention, FIG. 6 shows an example of an installation for implementing the dose measurement.

DETAILED DESCRIPTION OF AT LEAST ONE EMBODIMENT OF THE INVENTION

Dosimeter of Radiation

Figure 3B:
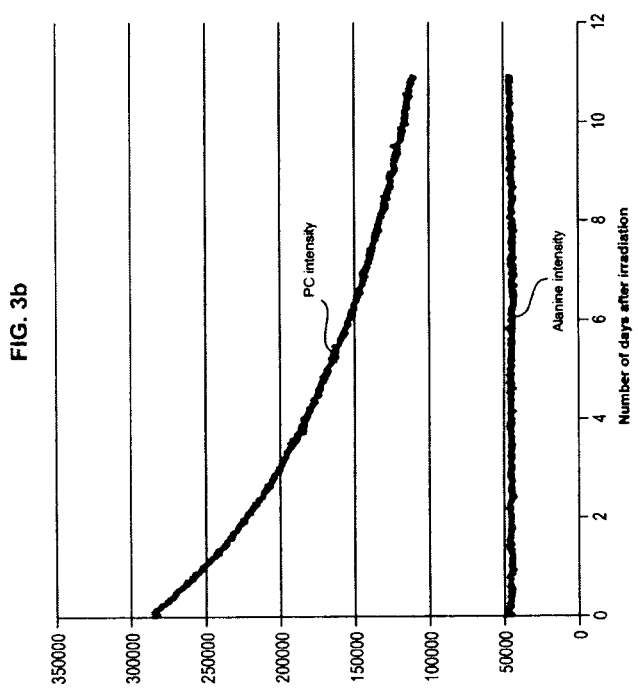
FIG. 3b shows the change in the amplitude of the EPR spectrum of a material with a constant spectrometric response after an irradiation.

In reference to FIG. 2a, an example of a radiation dosimeter for EPR spectroscopy is shown.

This dosimeter 1 comprises a quantity of dosimetric material 10, i.e. of material that, after having interacted with ionizing radiation (after having been subjected to irradiation), comprises paramagnetic entities of the free radical, hole or ion type.

These paramagnetic entities can be examined by EPR spectroscopy in order to determine the radioactive dose absorbed by the dosimetric material. To do this, a measurement of the dose is taken by EPR spectroscopy of the dosimetric material in order to obtain an EPR spectrum, and the intensity of the signal of the dosimetric material is measured in order to deduce the dose absorbed from it.

EPR spectrum or EPR signal refers to the derivative of the spectrum or of the absorption signal of energy of the material. The absorption spectrum can be established in the following two ways:
- either by subjecting the material to a constant magnetic field and by applying to it a beam of electromagnetic waves of which the energy or the frequency is varied, the derivative of the spectrum is therefore a derivative in relation to the energy (or the frequency) of the electromagnetic waves,
- or by subjecting the material to a beam of electromagnetic waves of energy (and of frequency) that is constant, and by applying to it a magnetic field of variable intensity, the derivative of the spectrum is then a derivative in relation to the intensity of the magnetic field.

In general, it is the peak-to-peak amplitude of the derivative of the absorption which is measured in order to determine the dose absorbed by the material.

In what follows, the derivative of the absorption line is called the "EPR line".

The dosimeter 1 further comprises a hermetically sealed enclosure 20 in order to contain the dosimetric material. The dosimetric material 10 is entirely contained in a volume 21 delimited by the enclosure, in such a way as to be hermetically confined in said volume.

Responses by EPR Spectroscopy of the Materials of the Radiation Dosimeter

The enclosure 20 is constituted of a material that has a response by EPR spectroscopy that is separate from the response by EPR spectroscopy of the dosimetric material for an identical irradiation, i.e. with the same energy, the same dose rate and for the same period of time. The term "response by EPR spectroscopy" refers to the change in time in the quantity of paramagnetic entities generated during an irradiation in the material.

In other terms, the response by EPR spectroscopy is the change in the EPR spectrum according to the time elapsed after the irradiation, at constant EPR spectroscopy measurement parameters.

On the other hand, a non-paramagnetic material, and for which the interaction with ionizing radiation does not generate any paramagnetic entity does not have an EPR signal.

Alternatively, a dosimetric material favored in EPR spectroscopy such as alanine has, after its irradiation, a response by EPR spectroscopy that is quasi-constant according to the time, i.e. the EPR spectrum does not change after the irradiation, at constant parameters of the measurement. Furthermore alanine has the advantage of having physical-chemical characteristics that are close to biological tissues, it is therefore used in priority to determine the doses absorbed by biological tissues during medical treatments or simulation of accidental exposure to ionizing radiation.

The fact that the material of the enclosure 20 has a response by EPR spectroscopy that is different from the response of the dosimetric material after identical irradiation, and even inexistent, makes it possible to completely irradiate the dosimeter 1 then to deduce from a measurement in EPR spectroscopy of the dosimeter the dose absorbed by the dosimetric material, without having to extract said material in order to analyze it separately. This suppresses the need of manipulating the dosimetric material between the irradiation and the measurement.

In this respect, according to a privileged embodiment of the invention, the material that constitutes the enclosure 20 of the dosimeter does not have an EPR signal after irradiation. Thus, the response of the dosimeter by EPR spectroscopy after irradiation corresponds solely to the response of the dosimetric material.

Alternatively, as shown in FIG. 3a and in FIG. 4, the material of the enclosure 20 has an EPR signal of which the intensity decays over time after an irradiation, which corresponds to a progressive disappearance of the paramagnetic entities generated during the irradiation.

In particular, an EPR signal decaying over time means that there is a period of time $\Delta T$ after the irradiation at the end of which the material no longer has a measurable EPR signal, or a residual signal of which the intensity is less than 5% of that measured just after irradiation.

The curve shown in FIG. 3a shows the change in the ambient temperature of the peak-to-peak amplitude of the EPR line of the polycarbonate according to the time passed after an irradiation of the material. It is observed that this amplitude is less than 5% of the initial amplitude during the irradiation about 15 days after the irradiation.

FIG. 4 shows the decay as a function of the time of the EPR signal of the polycaprolactone (PCL).

Thus, in order to obtain the EPR spectroscopy measurement of the dosimetric material contained in the dosimeter, it is sufficient to wait for this period of time after irradiation to have elapsed; the material of the enclosure then does not disturb the measurement.

In this case, the dosimetric material must always have a measurable EPR signal after the elapse of the period of time $\Delta T$, which is the case in the advantageous situation wherein the dosimetric material chosen has a signal that is stable in time after the irradiation.

This is the case shown in FIG. 3b, which shows a comparison of the peak-to-peak amplitudes of the EPR lines in absolute value for the polycarbonate of FIG. 3a and for the alanine.

Advantageously, the material chosen for the enclosure has an EPR signal with a decaying response such as polycaprolactone or polycarbonate.

According to an alternative embodiment, the respective EPR spectra of the dosimetric material and of the material of the enclosure after the same irradiation and an identical period of time after this irradiation extend over separate value ranges.

In the case where the EPR lines of the materials used for the enclosure 20 extend over separate magnetic field ranges and advantageously separate from the EPR spectrum of the dosimetric material 10, then these materials can also be used.

Therefore, it is sufficient to adapt the parameters of the magnetic field and/or of the frequency of the electromagnetic waves so that these parameters correspond to the selection that makes it possible to obtain the EPR spectrum of the dosimetric material. This spectrum is thus obtained, which is not disturbed by the spectrum of the material of the enclosure since the latter is located in a separate range of values.

As the condition on the spectrometric characteristics of the material of the enclosure and of the dosimetric material is fixed, many possibilities are offered concerning the choice of the materials.

Concerning the dosimetric material on the one hand, it is advantageously chosen from the materials favored for dosimetry by EPR spectroscopy.

Very advantageously, the dosimetric material is placed in powder or solid form in the enclosure 20, since it is not manipulated after having been irradiated, it is for example superfluous to mix it with an excipient in order to give it a stable form.

Alternatively, the dosimetric material can also be in liquid form.

The material used is advantageously an amino acid, ammonium formate, potassium dithionate, a polymer, dental enamel, carbohydrates, mineral glasses, bone, etc. Very advantageously, the material is alanine, in the form of a pure powder, i.e. without excipient.

In any case, the use of dosimetric material in pure form is made possible by the absence of transferring the material between the irradiation and the measurement. This furthermore makes it possible to miniaturize the dosimeter, since its dimensions are no longer restricted by the size of the pellets of alanine used in prior art.

As such, the dosimeter can advantageously be shaped to have dimensions similar to or less than the dimensions of the beams of ionizing radiation used for example in medicine. As such for example, the dosimeter can have a cylindrical or spherical shape with a diameter between 0 and 5 mm, and advantageously less than 2 mm.

The shape of the dosimeter is not however limited to such a shape; it can alternatively be parallelepiped, or of any other desired shape.

Concerning the enclosure on the other hand, it is advantageously made from a material that is sealed from liquids and gases. This makes it possible for example to position the dosimeter in a water tank commonly used for the calibration and verification of the precision of irradiation devices used for medical purposes. This also makes it possible to prevent the interaction of the dosimetric material with the ozone produced in the air during the irradiation, which can affect the response of the dosimeter. This also makes it possible to consider using dosimetric materials of which the decay of the EPR signal is linked to the interaction with water or oxygen for example.

In this case, the dosimeter is advantageously miniaturized in order to have dimensions of a magnitude of the irradiation beam used, i.e. of a magnitude of a millimeter.

The material that constitutes the enclosure is furthermore advantageously a material that is biocompatible in terms of the standard ISO10-993 or that can be placed in a living organism during the time of irradiation without interacting with the living environment or without causing and damage therein. This is the case for example with materials such as dental resin or polycaprolactone.

This makes it possible to place a dosimeter in an organism that is subsequently irradiated, for example for therapeutic reasons or for radiobiology experiments. The in vivo measurement of the dose received by the dosimetric material makes it possible to control the dose received by the organism at the located where the dosimeter is.

Finally, as can be seen in FIG. 2b, the enclosure 20 advantageously comprises an etched or printed marking or a radio-opaque insert 29, for example made of metal, which can be removable or which advantageously has a response in EPR spectroscopy that is separate from that of the dosimetric material in order to be able to differentiate between them during the measurement.

A marking can be for example a graduation, making it possible to very precisely position the dosimeter.

A radio-opaque insert also makes it possible to view via radiological imaging the position of the dosimeter when it is inserted into an opaque environment, for example into a living organism.

In order to ensure that the dosimetric material is hermetically contained in the enclosure of the dosimeter, several structures of the enclosure can be carried out.

According to a first embodiment, shown in FIG. 2a, the enclosure 20 is carried out in two portions 22, 24 conformed to cooperate together in order to form the hermetic enclosure.

As such a portion 22 can be a female portion suited to receive a male portion 24 of which the protuberance 25 can be hollow, in order to define the inner volume 21 of the enclosure once the latter is closed.

The portions 22 and 24 can be made integral together by any means. For example by elastic nesting (clipping), if one of the two portions has on an outer surface a groove adapted to receive a protrusion that is complementary with the other portion.

The portions 22 and 24 can also be screwed as in FIG. 2a, by having in this respect complementary threading 26, 28.

The portions 22 and 24 can also be glued (by adding material, in particular glue) or welded (no adding of material but local melting of the material forming the enclosure of at least one portion in order to adhere to the other portion) together.

The portions 22 and 24 can also be made integral by clamping, for example of the cone-cone sliding type between a male protuberance at the truncated cone and a complementary female housing, also at the truncated cone.

According to an alternative embodiment shown in FIG. 2b, the enclosure can be made from a single part from a ductile material, for example wax, making it possible to insert the quantity of dosimetric material into a preformed enclosure, then to deform the enclosure in order to close it around the dosimetric material. Alternatively, the dosimetric material can be injected directly into the enclosure, with the latter then able to be deformed in order to close a hole consecutive to the injection. In yet another alternative, an injection hole can be provided initially in a portion of the enclosure, with this hole then being plugged either by a complementary portion, or by locally melting the material of the enclosure around the hole.

It is also possible to confine the dosimetric material in an enclosure 20 made via micro-encapsulation.

It is therefore important that the material used to carry out the enclosure 20 be a formable material, i.e. a material that can be molded, or injected, then where applicable machined, because it thus makes possible the forming of dosimeters of all possible shapes and all possible dimensions. In particular, the dosimeter can be of a size of a magnitude of the millimeter, and even less, which allows for an increased precision of the measurement of the doses in a defined location.

A preferred material for carrying out the enclosure 20 of the dosimeter is polycaprolactone (or PCL). This material has the advantage of having an EPR signal that decays over time until it disappears in about 1000 minutes after an irradiation.

In addition, the intensity of the EPR signal of the PCL after irradiation is decreased if the PCL has beforehand been subjected to a pre-irradiation, advantageously of at least 300

Gy. It is therefore advantageous to carry out a pre-irradiation of the material before using it as an enclosure 20 of the dosimeter, because then the intensity of the EPR signal after the irradiation is less than if the material had not been pre-irradiated, and any parasite EPR signals of the PCL are suppressed.

Furthermore, this material can be molded, which makes it possible to give the dosimeter any shape, and also to close the enclosure 20 by sealing it by means of a quantity of melted material.

In reference to FIG. 4, the main steps of a method 1000 of dosimetry by EPR spectroscopy in accordance with the invention are shown.

This method makes it possible to measure the dose absorbed by the dosimetric material contained in a dosimeter described hereinabove, once said dosimeter has been irradiated at an unknown dose.

A first step 100 of the method consists in taking a measurement by EPR spectroscopy of a dosimeter 1 in order to obtain an EPR spectrum of said dosimeter. This step is a conventional step of EPR spectroscopy consisting is placing the dosimeter in a magnetic field B and in an orthogonal electromagnetic field E, and to vary the intensity of the magnetic field or the frequency (or the energy) of the electromagnetic waves in order to obtain the spectrum.

As shown in FIG. 6, it is sufficient to place the irradiated dosimeter in a support 2 provided for this purpose, and to place the support 2 in the resonant cavity 3 of an EPR spectrometer (not shown in the figure) with the support not affecting the measurement since it was not irradiated.

Then, the method comprises a step 200 consisting in deducing from the EPR spectrum of the dosimeter the intensity of the EPR spectrum of the dosimetric material that it contains, i.e. for example the amplitude of the EPR line of the dosimetric material.

To do this, several embodiments can be considered. According to a first embodiment, the material of the enclosure of the dosimeter does not have an EPR signal at the time of the implementation of the method of measurement. This is the case when the material never has an EPR signal after irradiation, or when it has a decaying response and the measurement is taken after a period of time ΔT at the end of which the amplitude of the EPR spectrum of the material is zero or constant, i.e. where the peak-to-peak amplitude of the EPR line of the material is zero.

In this case, the EPR signal of the dosimeter corresponds to the EPR signal of the dosimetric material, and the intensity of the signal of the dosimetric material can be measured by measuring the intensity of the EPR signal of the dosimeter.

Thus according to the embodiment where the peak-to-peak amplitude of the EPR line of the dosimetric material is measured, this amplitude corresponds to that of the EPR line of the dosimeter.

Alternatively, the material of the enclosure of the dosimeter has an EPR line extending over a range of energies/frequencies of the electromagnetic waves or of intensities of magnetic field that are separate from that of the EPR line of the dosimetric material.

In this case, knowing the response by EPR spectroscopy of the dosimetric material that is being studied, it is sufficient to measure the peak-to-peak amplitude of the EPR spectrum of the dosimeter on the energy/frequency of the electromagnetic waves or on the intensity of the magnetic field that corresponds to the absorption peak of the dosimetric material.

Finally, in the case where it is not possible to distinguish the EPR spectrum of the enclosure of the dosimeter from the spectrum of the dosimetric material, the step 200 comprises a substep 210 of deconvolution of the RPE spectrum of the dosimeter in order to obtain the EPR spectrum of the dosimetric material. The intensity of the EPR spectrum of the dosimetric material can then be measured during a substep 220.

The method 1000 finally comprises a step 300 consisting in deducing, from the intensity of the EPR signal measured (for example the peak-to-peak amplitude of the EPR line), a value of the dose absorbed by the dosimetric material.

To do this, according to a first embodiment, the method 310 by "standard addition" can be implemented, during which the dosimeter is subjected to additional irradiations at known doses, and as previously a measurement is taken by EPR spectroscopy of the dosimeter at each additional irradiation in order to deduce therefrom the intensity of the EPR signal of the dosimetric material for each dose added.

It is then measured, at each variation of the dose brought to the dosimeter, the variation of the intensity resulting on the EPR spectra of the dosimetric material, in order to deduce therefrom a sensitivity coefficient of the dosimeter (indicating the variation in intensity according to the variation of the dose) making it possible to extrapolate, for a given intensity of the EPR signal of the dosimetric material, the dose initially received.

Alternatively, a calibration curve that was previously carried out using dosimeters identical to the one that is being studied, with this calibration curve having been carried out by irradiating these dosimeters with several known doses and by measuring the amplitude of the EPR spectrum of the dosimetric material for each dose.

The step 300 then comprises the comparing 320 of the amplitude with the calibration curve and the deduction of the corresponding dose.

The method proposed therefore makes it possible to measure the dose absorbed by the dosimetric material more rapidly since it is not necessary to transfer it in order to take the measurement.

Furthermore, this measurement is more precise since there is no risk of losing the material during manipulations, and since it is not necessary to have recourse to an excipient in order to confer to the dosimetric material a solid consistency, as the excipient can degrade the precision of the measurement as explained hereinabove.

The invention claimed is:

1. Dosimeter of radiations for EPR spectroscopy, the dosimeter being suitable for being irradiated and undergoing a radiation dose measurement by EPR spectroscopy, and comprising:
   a quantity of dosimetric material, having a response by EPR spectroscopy that is constant according to the time after irradiation of said dosimetric material, and
   a closed enclosure containing said dosimetric material, the dosimetric material being hermetically contained in the closed enclosure,
   the enclosure being made from a material that does not have a response by EPR spectroscopy or that has a response by EPR spectroscopy that is different from the response of the dosimetric material after identical irradiation, such that the signal measured by EPR spectroscopy of the material of the enclosure decays according to the time after irradiation of said material such that a period of time exists after irradiation at the end of which the material does not have any measurable EPR signal, or a residual signal of which the intensity is less than 5% of that measured after irradiation, such that a radiation dose received by the dosimeter is measurable using an EPR spectrometer, without separating the dosimetric material from the closed enclosure before measurement.

2. Dosimeter according to claim 1, wherein the dosimetric material is in powder, solid or liquid form.

3. Dosimeter according to claim 1, wherein the enclosure is made from a material that is sealed from liquids and gases.

4. Dosimeter according to claim 1, wherein the enclosure is made from a material that is biocompatible in terms of the standard ISO10-993.

5. Dosimeter according to claim 1, wherein the enclosure further comprises an etched or printed marking, or a radio-opaque insert.

6. Dosimeter according to claim 1, wherein the material wherein is carried out the enclosure is polycaprolactone or polycarbonate.

7. Dosimeter according to claim 1, wherein the dosimetric material and the material of the enclosure have EPR signals each comprising an absorption line of electromagnetic energy according to a magnetic field applied to the material, the absorption lines of the dosimetric material and of the material of the enclosure extending respectively over:
   separate ranges of energies with an identical magnetic field, or
   separate ranges of magnetic fields with identical electromagnetic energy.

8. Dosimeter according to claim 1, wherein the dosimetric material is chosen from among the following group: alanine, bone, carbohydrates, ammonium formate, potassium dithionate, mineral glasses, dental enamel, dentine, polymers.

9. Dosimeter according to claim 1, wherein the dosimetric material is pure.

10. Method for measuring a radiation dose absorbed by a quantity of dosimetric material contained in a dosimeter according to claim 1 by EPR spectroscopy, said dosimeter having been irradiated with an unknown radiation dose during an irradiation, with the method being implemented after the period of time elapsed after the irradiation of the dosimeter at the end of which the material of the enclosure does not have an EPR signal, with the EPR signal of the dosimeter then corresponding to the EPR signal of the dosimetric material, and comprising the steps consisting in:
   implementing a measurement by EPR spectroscopy of the dosimeter in order to obtain an EPR signal of the dosimeter,
   deducing from the EPR signal of the dosimeter the intensity of the EPR signal of the dosimetric material, and
   calculating from the intensity of the EPR signal of the dosimetric material, the unknown radiation dose absorbed by said material.

11. Method for measuring according to claim 10, wherein the deducing of the intensity of the EPR signal of the dosimetric material using the EPR signal of the dosimeter comprises the obtaining of the EPR signal of the dosimetric material by deconvolution of the EPR signal of the dosimeter and the measurement of the intensity of the EPR signal of the dosimetric material.

12. Method for measuring according to claim 10, wherein the material of the enclosure has been subjected to a pre-irradiation before the irradiation of the dosimeter.

13. Method for measuring according to claim 10, wherein the deducing of the radiation dose absorbed by the dosimetric material comprises the steps consisting in:
   irradiating the dosimeter at a plurality of known radiation doses, and at each irradiation, implementing a measurement by EPR spectroscopy of the dosimeter, and deducing from the signal obtained an EPR signal of the dosimetric material,
   determining a sensitivity coefficient of the dosimeter, and
   extrapolating, using the intensities of the EPR signals of the dosimetric material, the radiation dose absorbed by the dosimeter.

14. Method for calibrating a dosimeter, the dosimeter comprising a quantity of dosimetric material having a response by EPR spectroscopy that is constant according to the time after irradiation of said dosimetric material, and a closed enclosure containing said dosimetric material, the dosimetric material being hermetically contained in the closed enclosure,
   the method comprising the irradiation of the dosimeter at a plurality of known radiation doses, and the implementing, at each irradiation, of a measurement by an EPR spectrometer of the intensity of the EPR signal of the dosimeter, after the period of time elapsed after the irradiation of the dosimeter at the end of which the material of the enclosure does not have an EPR signal, in order to establish a relationship between the value of the intensity of said signal and the radiation dose received.

15. Method for manufacturing a dosimeter, comprising:
   the formation of an enclosure in one or two portions by molding, injection or machining;
   the insertion of a quantity of dosimetric material, having a response by EPR spectroscopy that is constant according to the time after irradiation of said dosimetric material into a portion of the enclosure;
   the enclosure being made from a material that does not have a response by EPR spectroscopy or that has a response by EPR spectroscopy that is different from the response of the dosimetric material after identical irradiation; and
   and the hermetic sealing of the enclosure, so that the dosimetric material is hermetically contained in the closed enclosure.

* * * * *